United States Patent
Hur

(10) Patent No.: US 6,225,558 B1
(45) Date of Patent: May 1, 2001

(54) CHIP SIZE SEMICONDUCTOR PACKAGE AND FABRICATION METHOD THEREOF

(75) Inventor: Ki-Rok Hur, Cheongju (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/093,724

(22) Filed: Jun. 9, 1998

(30) Foreign Application Priority Data

Dec. 12, 1997 (KR) .................................. 97-68007

(51) Int. Cl.[7] .............................. H02G 3/08; H05K 5/00
(52) U.S. Cl. .................. 174/52.1; 361/767; 257/686; 257/692; 257/693; 257/690; 257/773; 257/777; 438/109
(58) Field of Search .......................... 174/52.1; 361/767; 257/690, 696, 692, 693, 773, 777, 686; 438/109

(56) References Cited

U.S. PATENT DOCUMENTS

| | | | |
|---|---|---|---|
| 4,890,154 | * 12/1989 | Sahakian | 357/74 |
| 5,053,852 | * 10/1991 | Biswas et al. | 357/74 |
| 5,363,279 | 11/1994 | Cha | 361/767 |
| 5,583,375 | * 12/1996 | Tsubosaki et al. | 257/692 |
| 5,835,988 | * 11/1998 | Ishii | 257/684 |
| 6,002,167 | * 12/1999 | Hatano et al. | 257/696 |
| 6,018,191 | * 1/2000 | Murakami et al. | 257/691 |

* cited by examiner

*Primary Examiner*—William A. Cuchlinski, Jr.
*Assistant Examiner*—Ronnie Mancho
(74) *Attorney, Agent, or Firm*—Fleshner & Kim, LLP

(57) ABSTRACT

A chip size semiconductor package (CSP) and method of manufacturing same is provided that increases solder joint reliability and increases an amount of radiated heat. The chip size semiconductor package includes a semiconductor chip having a plurality of bonding pads on a first surface, a plurality of first leads connected to the bond pads on the first surface of the semiconductor chip and a plurality of connection members couple the bonding pads and the first leads. A plurality of second leads are formed on the upper surfaces of the first leads. The second leads have first portions formed on upper outer portions of the first leads and second portions extended from the first portions and upwardly bent. A molding portion molds the connection members formed on the semiconductor chip and the first leads and the first portions of the second leads whereby the second portions of the second leads are exposed. The second leads are inwardly bent in a prescribed shape and bonded to an upper surface of the molding portion.

11 Claims, 3 Drawing Sheets

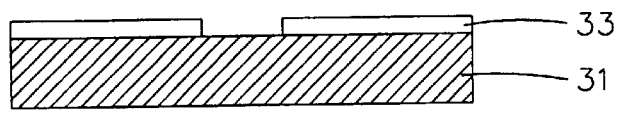
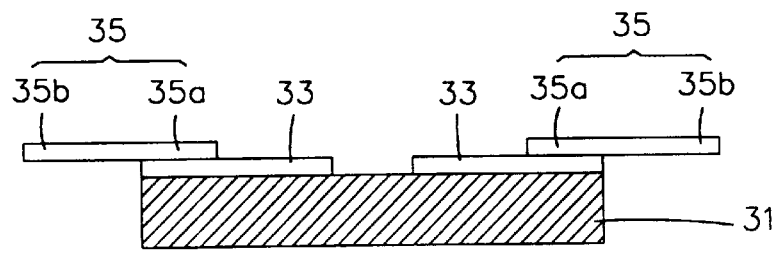
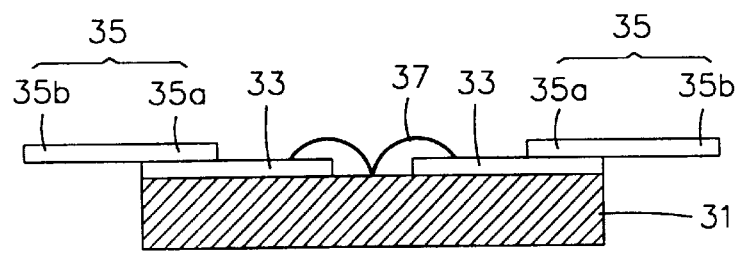
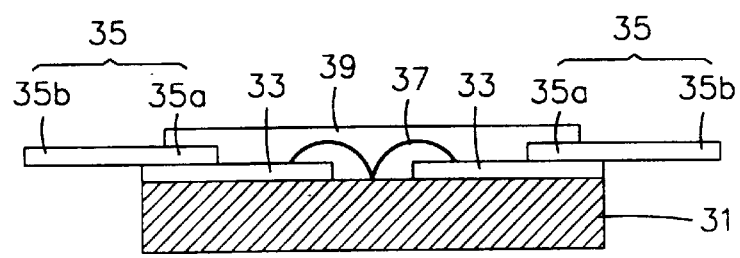
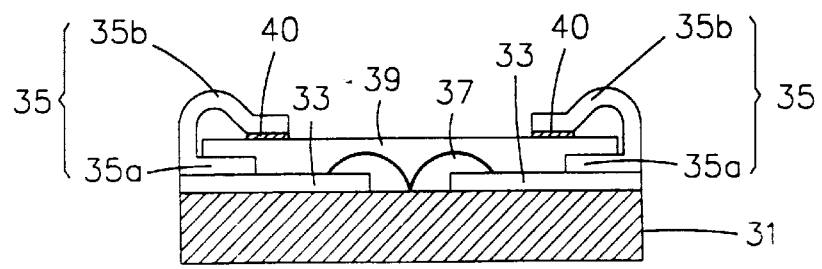

CHIP SIZE SEMICONDUCTOR PACKAGE AND FABRICATION METHOD THEREOF

BACKGROUND OF THE INVENTION

1. Field of the Invention

The present invention relates to a semiconductor package and a fabrication method thereof, and in particular to a chip size semiconductor package (CSP) and a fabrication method thereof.

2. Background of the Related Art

FIG. 1 illustrates a conventional thin small on-line package (TSOP). The problems encountered in the conventional thin small on-line package are described in the U.S. Pat. No. 5,363,279 ('279). FIG. 2 illustrates a bottom lead package (BLP) of the '279 patent, which is assigned to the same assignee as the present invention. The BLP has a disadvantage in that the reliability of the solder joint is decreased compared to the TSOP. In the conventional BLP, if there is not a solder joint between a lead and a printed circuit board (PCB), a delamination and a cracking problem occur in the solder joint. In addition, since the conventional TSOP and BLP shown in FIGS. 1 and 2 are fully sealed by a molding compound, it is difficult to effectively radiate the heat generated in the semiconductor chip.

The above references are incorporated by reference herein where appropriate for appropriate teachings of additional or alternative details, features and/or technical background.

SUMMARY OF THE INVENTION

An object of the present invention is to provide a chip size semiconductor package and a fabrication method thereof that substantially overcome one or more of the problems encountered in the background art.

Another object of the present invention is to provide a chip size semiconductor package and a fabrication method thereof that enhances solder joint reliability to a lead frame.

Another object of the present invention is to provide a chip size semiconductor package and a fabrication method thereof that enhances a mounting capability when mounting a semiconductor package on a printed circuit board (PCB).

Another object of the present invention is to provide a chip semiconductor package and a fabrication method thereof that effectively radiates the heat generated in a semiconductor chip.

Another object of the present invention is to provide a chip size semiconductor package and a fabrication method thereof that provides a light and compact CSP.

To achieve at least the above objects in a whole or in parts, there is provided a chip size semiconductor package according to the present invention that includes a semiconductor chip having a plurality of bonding pads, a plurality of first leads extended from both sides of an upper surface of the semiconductor chip for corresponding with the bonding pads, a plurality of conductive members for electrically coupling the bonding pads and the first leads, a plurality of second leads formed on upper surfaces of the first leads, wherein the second leads have first portions formed on upper outer portions of the first leads and second portions extended from the first portions and upwardly bent, and a molding portion for molding the conductive members formed on the semiconductor chip, the first leads and the first portions of the second leads in a manner that the second portions of the second leads are exposed.

To further achieve the above objects, there is provided a chip size semiconductor package fabrication method according to the present invention that includes the steps of preparing a semiconductor chip having a plurality of bonding pads, forming a plurality of first leads on both sides of the semiconductor chip for corresponding with the bonding pads, forming a plurality of second leads having first portions and second portions on the upper outer end portions of the first leads wherein the first portions are bonded to the first leads and the second portions protrude from the semiconductor chip, electrically coupling the bonding pads and the first leads using connection members, forming a molding portion for sealing the connection members formed on the semiconductor chip, the first leads and the first portions of the second leads so that the second portions of the second leads are exposed, and forming the second portions of the second leads.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5A–5E are cross-sectional diagrams illustrating a preferred embodiment of a chip size semiconductor package fabrication method according to the present invention.

DETAILED DESCRIPTION OF PREFERRED EMBODIMENTS

Figure 1:
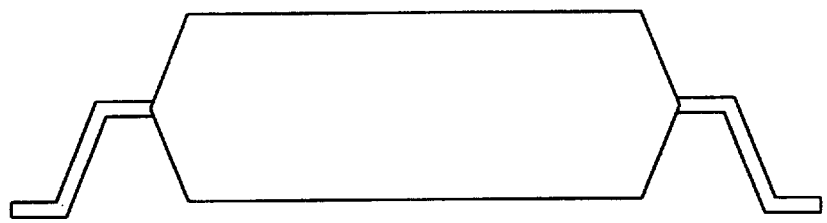
FIG. 1 is a diagram illustrating a conventional thin small on-line package (TSOP)
Figure 2:
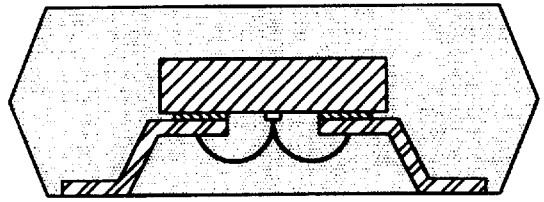
FIG. 2 is a cross-sectional diagram illustrating a conventional bottom-lead package (BLP)
Figure 3:
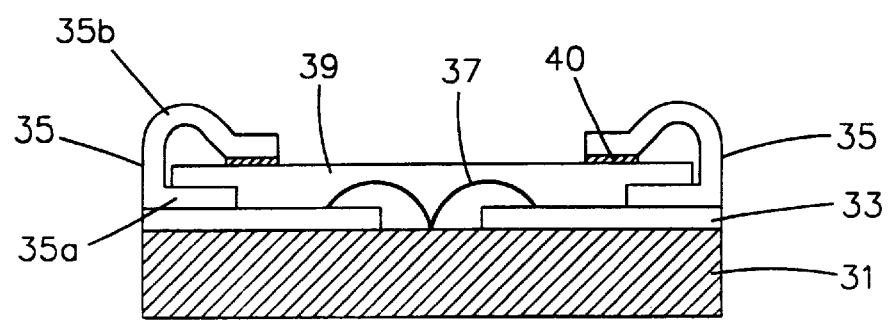
FIG. 3 is a cross-sectional diagram illustrating a preferred embodiment of a chip size semiconductor package (CSP) according to the present invention.

FIG. 3 is a diagram illustrating a preferred embodiment of a chip size semiconductor packages (CSP) according to the present invention. As shown in FIG. 3, a semiconductor chip 31 has a plurality of bonding pads (not shown). A plurality of first leads 33 are extended from both sides of the semiconductor chip 31 and are preferably aligned with the bonding pads. The first leads 33 each include an adhering layer 41, an insulation layer 43 formed on the upper surface of the adhering layer 41 and a conductive layer 45 formed on the upper surface of the insulation layer 43. The adhering layer 41 of each of the first leads 33 is bonded on the upper surface of the semiconductor chip 31.

Figure 4A:
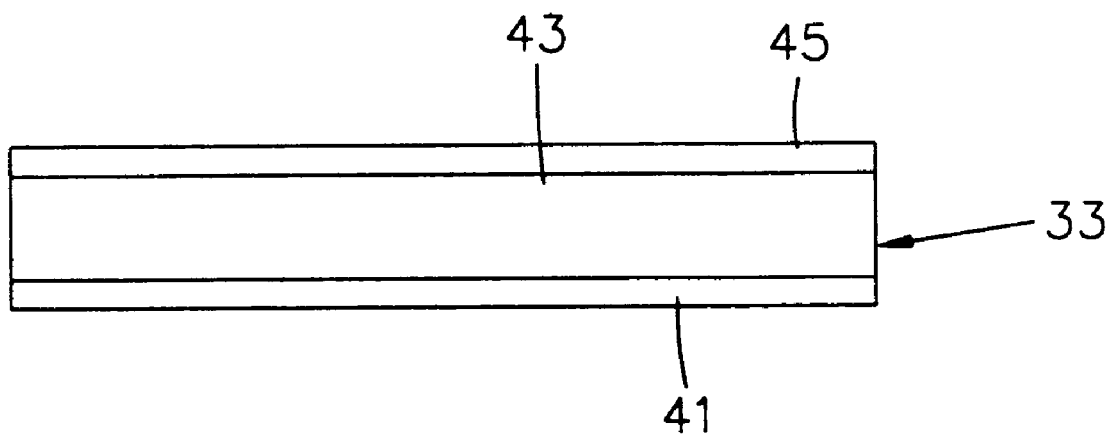
FIGS. 4A and 4B are cross-sectional diagrams illustrating a first lead and a second lead of FIG. 3.
Figure 4B:
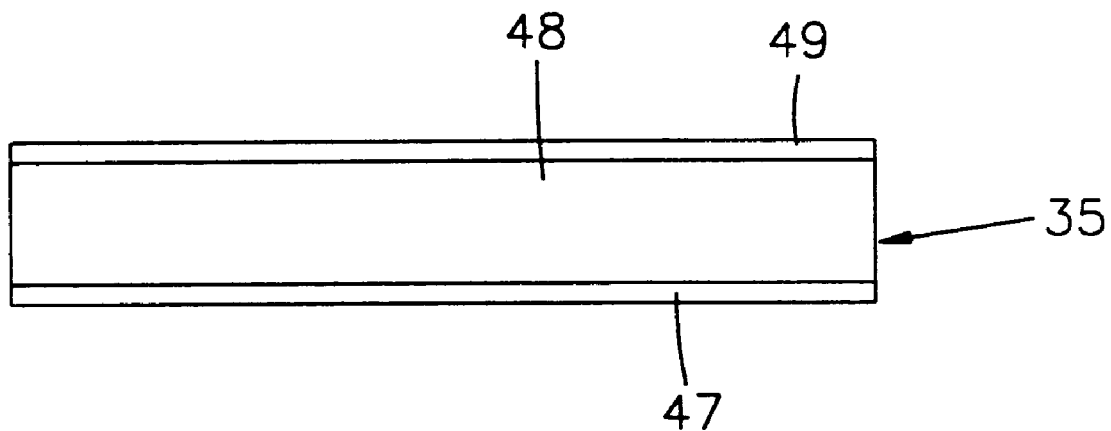

A plurality of second leads 35 are formed on the upper surface of the conductive layer 45 of the first leads 33. Each of the second leads 35 includes a first portion 35a formed on the upper end portion of each of the first leads 33 and a second portion 35b upwardly extended from the first portion 35a. As shown in FIG. 4B, the second leads 35 each include an adhering layer 47, an insulation layer 48 formed on the upper surface of the adhering layer 47, and a conductive layer 49 formed on the upper surface of the insulation layer 48. The conductive layer 49 of the second leads 35 is bonded on the upper surface of the first leads 33. The second leads 35 shown in FIG. 4B preferably have the similar construction to the first leads 33 shown in FIG. 4A.

Returning to FIG. 3, a plurality of conductive connection members 37 are electrically coupled between the bonding pads (not shown) of the semiconductor chip 31 and the inner end portions of the first leads 33. In the preferred embodiment of the CSP according to the present invention, the conductive connection members 37 are made of conductive wires 37. However, the present invention is not intended to be limited to this. For example, bumps (not shown) may be used for the conductive connection members 37. A molding portion 39 molding the first leads 33, the first portions 35a of the second leads 35 and the wires 37 is formed on the upper surface of the semiconductor chip 31. The second portions 35b of the second leads 35 are exposed in the molding portion 39. The outer end portions of the second portions 35b of the second leads 35 are bonded on the upper surface of the molding portion 39 using an adhesive 40. When using the CSP shown in FIG. 3, the second portions 35b of the second leads 35 are preferably maneuvered to face downward, and the semiconductor chip 31 is flipped to face upward.

FIGS. 5A through 5E are cross-sectional diagrams illustrating a preferred embodiment of a CSP fabrication method according to the present invention. As shown in FIG. 5A, a semiconductor chip 31 having a plurality of bonding pads (not shown) is prepared. A plurality of first leads 33 are formed at both sides of the semiconductor chip 31 preferably aligned with the bonding pads.

As shown in FIG. 5B, a plurality of second leads 35 are formed in the upper end portions of the first leads 33. The second leads 35 each includes a first portion 35a and a second portion 35b. The first portion 35a is bonded to each of the upper end portions of the first leads 33. The second portion 35b protrudes outwardly from the semiconductor chip 31. As shown in FIGS. 4A and 4B, the first leads 33 and the second leads 35 are respectively formed by forming adhering layers 41 and 47, insulation layers 43 and 48 on the upper surfaces of the adhesive layers 41 and 47, and conductive layers 45 and 49 on the upper surfaces of the insulation layers 43 and 48. The first leads 33 are bonded to the upper surface of the semiconductor chip 31 using the adhesive layer 41 of the first leads 33, and the conductive layer 49 of the second leads 35 is bonded to the upper surface of the conductive layer 45 of the first leads 33.

As shown in FIG. 5C, the bonding pads of the semiconductor chip 31 and the conductive layer 45 of the first leads 33 are electrically coupled or bonded by a plurality of conductive wires 37. Preferably, the bonding pads of the semiconductor chip 31 and the first leads 33 are electrically coupled using bumps (not shown).

As shown in FIG. 5D, a molding portion 39 molds the first leads 33 formed on the upper surface of the semiconductor chip 31, the first portions 35b of the second leads 35, and the wires 37. At this time, the second portions 35b of the second leads 35 are exposed outside of the molding portion 39.

As shown in FIG. 5E, the second portions 35b of the second leads 35, which are exposed outside the molding portion 39 are trimmed. In the preferred embodiment of the fabrication method according to the present invention, the second portions 35b of the second leads 35 are upwardly bent and then re-bent inwardly to the center portion of the molding portion 39 so that the end portions of the second portions 35b contact with the upper surface of the molding portion 39. In addition, the end portions of the second portions 35b are bonded to the upper surface of the molding portion 39 using an adhesive 40. The second leads 35 may be formed in a predetermined shape, for example, in a J-shape.

As described above, the preferred embodiments of the CSP and method of manufacturing same have various advantages. In the preferred embodiments of the chip size semiconductor package and a fabrication method thereof, since the end portions of the second portions 35b of the second leads 35 are extended beyond the upper surface of the molding portion 39, when mounting the semiconductor package on a printed circuit board, the solder joint reliability is increased compared to the semiconductor BLP. Thus, the mounting reliability is increased relative to the semiconductor BLP. In addition, since the surfaces except the upper surface of the semiconductor chip 31 are exposed to the outside, the heat generated in the semiconductor chip can be effectively radiated.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A chip size semiconductor package, comprising:

a semiconductor chip having a plurality of bonding pads on an upper surface;

a plurality of first leads on the upper surface of the semiconductor chip;

a plurality of conductive members that couple each of the bonding pads to a corresponding lead of first leads;

a plurality of second leads formed on upper surfaces of the first leads, wherein the second leads have first portions contacting outer portions of the first leads and second portions extended from the first portions and upwardly bent; and a molding portion that packages the conductive connection members, the first leads and the first portions of the second leads such that the second portions of the second leads are exposed.

2. The package of claim 1, wherein each of said first leads and second leads comprises:

an adhesive layer;

an insulation layer formed on the adhesive layer; and a conductive layer formed on the insulation layer.

3. The package of claim 2, wherein the plurality of first leads extend from opposing sides of the upper surface of the semiconductor chip, and wherein said adhesive layers of the first leads are bonded on the upper surface of the semiconductor chip.

4. The package of claim 2, wherein the conductive layers of said first portions of the second leads are bonded to the conductive layer of the first leads.

5. The package of claim 1, wherein said conductive members are one of bumps and metal wires, or wherein said conductive members couple the bonding pads and the conductive layers of the first leads.

6. The package of claim 1, wherein the molding portion covers only the upper surface of the semiconductor chip, and wherein the second portions of the second leads extend beyond the upper surface of the molding portion.

7. The package of claim 1, wherein outer end portions of the second portions of the second leads are bonded on an upper surface of the molding portion using an adhesive.

8. The package of claim 1, further comprising a coupling joint for coupling to a printed circuit board, wherein the coupling joint couples the second portions of the second leads to the printed circuit board.

9. A chip size semiconductor package, comprising:
- a semiconductor chip having a plurality of bonding pads on an upper surface;
- a plurality of first leads extended from both sides of the upper surface of the semiconductor chip;
- a plurality of conductive members that electrically couple each of the bonding pads to a corresponding inner portion of one of the first leads;
- a plurality of second leads having first and second portions, wherein each of the second leads are formed on an upper surface of one of the first leads, wherein the first portions of the second leads are formed on upper outer portions of the first leads, and wherein second portions of the second leads extend from the first portions; and
- a molding portion that packages the conductive members formed on the semiconductor chip, the first leads and the first portions of the second leads such that the second portions of the second leads are exposed, and wherein the second portions of the second leads are upwardly and inwardly bent and bonded to an upper surface of the molding portion.

10. The chip size semiconductor package of claim 9, wherein each of said first leads and second leads comprises:
- an adhesive layer;
- an insulation layer formed on an upper surface of the adhesive layer; and
- a conductive layer formed on an upper surface of the insulation layer.

11. The package of claim 10, wherein said first portions of the conductive layer of the second leads are bonded to the conductive layer of the first leads, wherein the second leads form a prescribed shape, and wherein said outer end portions of the second portions of the second leads are bonded on the upper surface of the molding portion using an adhesive.

* * * * *